United States Patent [19]
König et al.

[11] Patent Number: 5,403,628
[45] Date of Patent: Apr. 4, 1995

[54] PROCESS FOR PRODUCING A COATED HARD-METAL CUTTING BODY

[75] Inventors: Udo König, Essen; Hans Kolaska, Bottrop, both of Germany

[73] Assignee: Krupp Widie GmbH, Essen, Germany

[21] Appl. No.: 64,040
[22] PCT Filed: Nov. 14, 1991
[86] PCT No.: PCT/DE91/00913
§ 371 Date: May 7, 1993
§ 102(e) Date: May 7, 1993
[87] PCT Pub. No.: WO92/09722
PCT Pub. Date: Jun. 11, 1992

[30] Foreign Application Priority Data

Nov. 24, 1990 [DE] Germany .......... 40 37 480.7

[51] Int. Cl.6 .......... B05D 3/06; B05D 3/02; C23C 16/00; C22F 1/10
[52] U.S. Cl. .......... 427/569; 427/577; 427/255.1; 427/228; 427/376.6; 427/374.4; 427/374.3; 419/14
[58] Field of Search .......... 427/226, 228, 229, 377, 427/380, 374.3, 374.4, 374.6, 564, 562, 567, 577, 569, 590, 582, 584, 586, 249, 255.1, 255.2, 255.3; 419/14

[56] References Cited

U.S. PATENT DOCUMENTS

| | | | |
|---|---|---|---|
| 4,018,631 | 4/1977 | Hale | 427/377 |
| 4,374,685 | 2/1983 | Suzuki et al. | 148/126.1 |
| 4,399,168 | 8/1983 | Kullander et al. | 427/377 |
| 4,478,888 | 10/1984 | Benjamin et al. | 427/377 |
| 4,729,905 | 3/1988 | Zhed et al. | 427/377 |
| 5,073,411 | 12/1991 | Hale | 427/377 |
| 5,209,945 | 5/1993 | Weber | 427/380 |

FOREIGN PATENT DOCUMENTS

| | | | |
|---|---|---|---|
| 2536422 | 5/1984 | France | 427/228 |
| 3309028 | 9/1984 | Germany | 427/288 |
| 0200557 | 12/1982 | Japan | 427/228 |
| 3-122280 | 5/1991 | Japan | 427/228 |
| 2204327 | 11/1988 | United Kingdom | 427/228 |
| 0815076 | 3/1981 | U.S.S.R. | 427/288 |

OTHER PUBLICATIONS

Patent abstracts of Japan, vol. 10, #345 (C-386) of JP,A, 61,-147,823 to Mitsubishi Metal Corp., Tanase Teruyoshi, "Prod. of N-containing high sintered hard Alloy", Jul. 1986.
Patent abs. of Jap., vol. 7, #155 (C-175) of JP,A, 58-067,859 to Hitachi, KK, Yuusuke Iyori, "Coated Sintered hard Alloy Prep Thereof" Apr. 1983.
Pat abs. of Jap., vol. 6, #68 (C-100) of JP,A, 57-005,860 to Nippon Tokushi Togyo, KK, Suzuki, "Prep. of Coating Tip for Cutting", Jan. 1982.

Primary Examiner—Marianne Padgett
Attorney, Agent, or Firm—Herbert Dubno

[57] ABSTRACT

A process for producing a cutting tool includes the steps of subjecting a sintered body to a nitrogen gas pressure treatment conducted under a pressure ranging between 0.2 and 10 MPa and at a temperature between 900° C. to 1300° C. for a period of at least 0.5 hours, evacuating a protective gas at a pressure between 10 Pa and 20 kPa at temperatures between 1000° C. and 1350° C. over more than 0.5 hours before the sintered body is cooled under a pressure between 10 Pa and 0.1 Pa, thereby forming a binding layer and treating a metal base body with CVD or PVD or plasma activated CVD for coating the metal base body with the binding layer.

12 Claims, 3 Drawing Sheets

PROCESS FOR PRODUCING A COATED HARD-METAL CUTTING BODY

CROSS REFERENCE TO RELATED APPLICATIONS

This is a national phase application corresponding to PCT/DE 91/00913, filed Nov. 14, 1991 and based, in turn, upon a German application filed as P 4037480.7 on Nov. 24, 1990.

FIELD OF THE INVENTION

The present invention relates to a process for producing a cutting body from a hard metal base body which is coated with one or more thin binder-metal-free hard material layers, whereby a WC, TiC, TaC and/or NbC with Co as binder metal, containing powder, is granulated with a pressing auxiliary agent and is pressed to a pressed body, the pressed body is under vacuum until complete elimination of the pressing auxiliary agent, and thereafter the pressed body under a nitrogen free protective gas is sintered and is coated by means of a CVD (Chemical Vapor Deposition) or PVD (Plasma Vapor Deposition) process.

BACKGROUND OF THE INVENTION

In the publication "Kieffer and Benesovsky", HARDMETALS, Springer-Verlag, Vienna-New York 1965, pages 202 to 216, WC—TaC (NbC)—Co hard metals and WC—TiC—TaC (NbC)—Co hard metals are indicated to be especially suitable for the machining of steel workpieces. These alloys are composed in the broadest ranges of 35 to 80% WC, 5 to 45% TaC, 0.5 to 30% TiC and 1 to 30% binder (iron, cobalt, nickel) and have a greater ductility than pure WC—TiC—Co alloys and greater cutting resistance. Such hard metals are useful as hard metal basis bodies which are to be coated with titanium carbide, titanium nitride and/or aluminum oxide (compare DE-B-22 63 210, DE-C-22 537 45). The coatings are applied according to the state of the art, for example, by the so-called CVD (Chemical Vapor Deposition) process to increase the wear resistance of the cutting body.

Nevertheless, the known coatings have a detrimental effect upon the ductility, i.e. the brittleness of the cutting body is increased. The basis for this (increase in brittleness) are tensile stresses which develop after cooling of the hard material layer applied at about 1000° C. by CVD and leading to cracks in the coating.

With higher mechanical stresses, therefore, there is the danger that cracks in the surface layer will propagate in the hard metal base body and finally give rise to breakout at the cutting edge. To avoid or to limit this disadvantageous effect, it has already been proposed to provide the hard metal base body with a ductility-increasing boundary zone. This zone close to the surface has a low content of cubic mixed carbides and carbonitrides or is free from cubic mixed carbides and carbonitrides and is enriched with such the binder metal as cobalt. As a consequence, the boundary zone has a greater ductility than the mixed carbide containing hard metal base body. The propagation of cracks from the coating into the hard metal is therefore retarded.

From DE 32 11 047 A1 and U.S. Pat. No. 4,548,786, basically two processes for producing the boundary zones enriched with cobalt and low in mixed carbides are known.

In the first process, nitrogen containing such compounds as, for example, titanium nitride or carbonitride are added to the mixture forming the hard metal in given quantities (compare DE 32 11 047 A1). With vacuum sintering of such mixtures at high temperatures between 1300° and 1500° C. diffusion processes take place which effect the described boundary zone modification.

In a further proposal (compare U.S. Pat. No. 4,548,786), one starts with a conventional mixture of hexagonal tungsten carbide, cubic carbides and cobalt and subjects and the mixture to the compacting sintering below the melting temperature of the binder metal at about 1250° C. to a treatment in nitrogen gas. The nitriding is so carried out that sufficient nitrogen is taken up in a short time by the cubic carbides to partially convert the cubic carbides into carbonitrides. In the subsequent sintering at a higher temperature in vacuum, the desired boundary zone effect is achieved as in the previously described process, whereby the boundary zone thickness lies between 10 to 50 μm.

The aforedescribed processes have, however, the disadvantage that many parameters influence the overall hard metal fabrication from the completion of the mixture through the pressing process to the final sintering and thus influence the desired result.

As a consequence, many cutting bodies must be subjected to milling following the sintering and then to aftergrinding with the requisite precision. As the grinding operation again removes the relatively thin boundary zone, the aforedescribed process cannot be used for ductility increase where the cutting bodies are highly stressed mechanically by the milling.

OBJECT OF THE INVENTION

The object of the invention is to provide a process which avoids the above-mentioned drawbacks and allows the formation of the boundary zones with a reduction in mixed carbides and an enrichment of binder metal so that the boundary zone is not affected by a subsequent sintering process nor any requisite grinding.

SUMMARY OF THE INVENTION

This object is achieved by a including the steps of
mixing and milling of a powder mixture containing tungsten carbide, titanium carbide, tantalum carbide, niobium carbide and cobalt and usually free from any nitrogen containing compounds,
granulation with pressing auxiliary agent and pressing to a pressed body corresponding to the cutting body,
temperature-pressure-time treatment in a plurality of steps:
heating to 300° to 600° C. under vacuum or inert gas and retaining the a temperature to which the pressed body is heated until the pressing auxiliary agent is completely driven off;
heating and sintering in argon at a temperature between 1280° and 1550° C. and a pressure between 10 Pa and 0.1 MPa,
gas pressure treatment, especially under pure nitrogen at a pressure between 0.2 and 10 MPa and a temperature between 900° and 1300° C.,
vacuum treatment in argon at pressure between $10^6$ Pa and 20 kPa and temperatures between 1000° and 1350° C., and
cooling of the sintered body under inert gas like argon between 10 Pa and 0.1 MPa, together with a final coating of the hard metal body with carbidic, nitridic and/or oxidic hard materials by a CVD (Chemical Vapor Deposition), PVD (Plasma Vapor Deposition) or plasma activated CVD (Chemical Vapor Deposition) process.

The nitrogen treatment duration following the sintering is inversely proportional to the temperature prevailing during this treatment and preferably should amount to at least 30 minutes.

There is indeed a process disclosed in DE 27 17 842 C2 for producing hard metal bodies with increased wear resistance in which the hard metal body after a final sintering is treated in a sinter autoclave at a temperature between 800° C. and a temperature lying 50° C. below the maximum sinter temperature, with nitrogen at a pressure between 2 bar (0.2 MPa) and 5000 bar (500 MPa), but this process leads to the production of hard metal bodies with a nitrogen containing boundary zone and wherein the hard metal body remains uncoated. A drawback of such approach is that the ductility properties of the thus produced hard metal body are not improved.

Especially when, according to the process of the invention following the sintering, no mechanical machining of the sintered body is necessary, can the nitrogen gas pressure treatment be carried out in a heat without an intervening cooling in conjunction with the sinter process. Alternatively it is possible to cool the sintered body initially and then grind it before it is subjected to the nitrogen gas treatment. With this process tough cutting bodies with very narrow mechanical tolerances in their dimensions can be produced.

Preferably the cooling is effected of the sintered body under a nitrogen free protective gas at a pressure between 10 Pa and 0.1 MPa so that before the unique gas pressure treatment under pure nitrogen or under a high nitrogen containing atmosphere, no nitrogen can diffuse into the sintered body.

In many cases, so-called combined sinter-HIP (Hot Isostatic Pressing) processes have been found to be effective, however, in which a pressure treatment is provided directly in conjunction with the sintering without intervening cooling, preferably under a nitrogen free protective gas pressure between 1 to 10 MPa at 1280° C. to 1550° C. The nitrogen gas pressure treatment can follow this sinter/HIP (Hot Isostatic Pressing) process.

The protective gas which has been found to be effective for the cooling is especially argon or hydrogen or mixtures thereof.

Finally, the finished machined sintered body is coated by means of the CVD (Chemical Vapor Deposition), PVD (Plasma Vapor Deposition) or plasma activated CVD (Chemical Vapor Deposition) process with one or more surface coatings of titanium carbide, titanium nitride, titanium carbonitride or aluminum oxide with a total thickness of 3 to 15 $\mu$m, preferably 5 to 10 $\mu$m. In this case, a layer sequence especially of titanium nitride, titanium carbonitride and titanium nitride has been found to be effective.

The hard metal alloys can especially contain 2 to 30 weight percent of cubic carbides and 4 to 15 weight percent cobalt as the binder metal.

According to a further feature of the process of the invention, it is possible to subject the pressed body after the pressing auxiliary agent has been driven off but before the sintering, to a heat treatment between 1280° C. and 1550° C. under a nitrogen atmosphere with a pressure up to 0.1 MPa for at least 30 minutes, preferably 45 to 60 minutes. To the extent that the ductility increasing boundary zone formed by this process is further removed fully or partly, this can be corrected by a gas pressure treatment carried out in conjunction with the finish sintering.

A corresponding operation applies as well for a process mode in which to the starting mixture is added 0.5 to 2 weight percent of a nitride or carbonitride of titanium, tantalum and/or niobium.

BRIEF DESCRIPTION OF THE DRAWINGS

The above and further objects, features and advantages will become more readily apparent from the following description, reference being made to the following drawing, in which.

SPECIFIC DESCRIPTION

Figure 1:
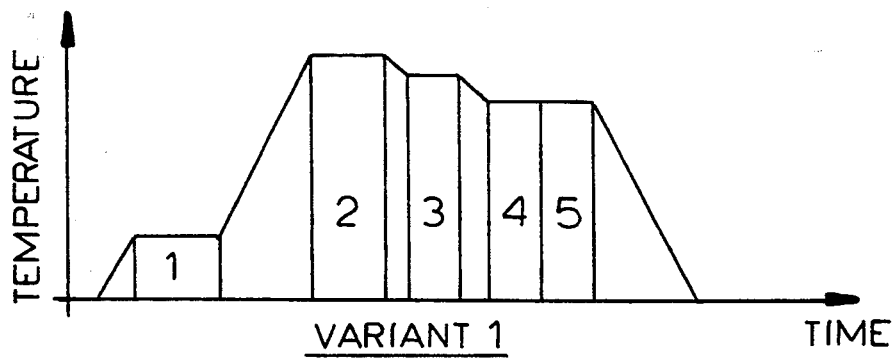
FIG. 1 and FIG. 2 are respective temperature-time diagrams with possible process modes.

In the process represented in FIG. 1, the starting powder mixture consists of 87 weight percent tungsten carbide, 2 weight percent titanium carbide, 3 weight percent tantalum carbide and 8 weight percent cobalt. This mixture is milled in a manner common according to the state of the art, is granulated with a pressing auxiliary agent and is compacted to a pressed body. Then the pressed body is heated to about 500° C. and held at this temperature sufficiently long for the pressing auxiliary agent to be completely driven off (Process Step 1)

This is followed by a heating to a temperature of 1450° C. in an evacuated sinter apparatus and a sintering at a maximum temperature of 1450° C. in vacuum with an argon atmosphere of a pressure of a maximum of 100 Pa (Process Step 2).

After a retention time of 30 minutes, the temperature is lowered to 1400° C. and for 30 minutes an argon pressure of 5 MPa is established (Process Step 3).

After a further reduction of the temperature to 1200° C., the argon is initially removed and thereafter the samples are treated initially for 2 hours in nitrogen at a pressure of 5 MPa (Process Step 4) and thereafter for 1 hour in vacuum of an argon pressure of about 100 Pa (Process Step 5) and finally cooling with slowly increasing argon pressure at room temperature.

Figure 3:
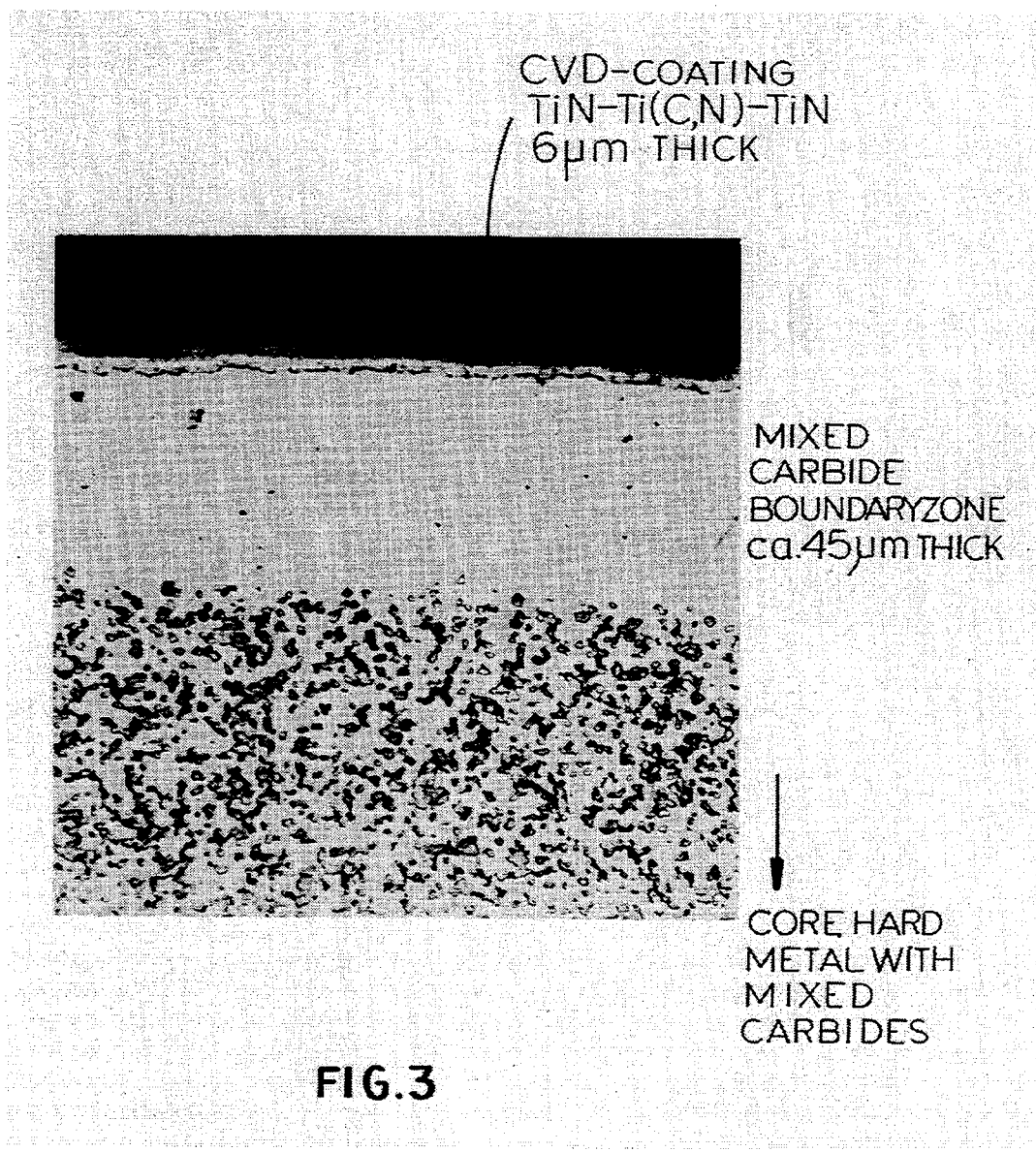
FIG. 3 is a photomicrograph of a hard metal cutting body according to the invention with a three-layer CVD coating.

Thereafter, the test bodies are initially provided with a thin titanium nitride layer by a CVD (Chemical Vapor Deposition) process and thereafter with a titanium carbonitride layer and finally with a titanium nitride layer also Preformed by a CVD process. Whereby the total thickness of the hard material layers, which are of approximately the same thickness, amounts to about 6 $\mu$m. A photomicrograph of a ground surface of the hard metal body thus produced is shown in FIG. 3 wherein following a special etching process, the mixed carbide grains, i.e. cubic mixed carbide (Ti, Ta, NB, W)C are made visible. The grains appear in the figure as dark. By contrast, the tungsten carbide components appear grey and the cobalt binder metal as whitish. The micrograph in FIG. 3 shows that to a depth of 45 $\mu$m under the surface of the body, no mixed carbide component can be found any longer. By contrast, the cobalt content of 8% in the interior of the sample has increased to 12.1% closely below the coating as could be determined by an analysis with the aid of electron beam induced spectroscopy.

Figure 4:
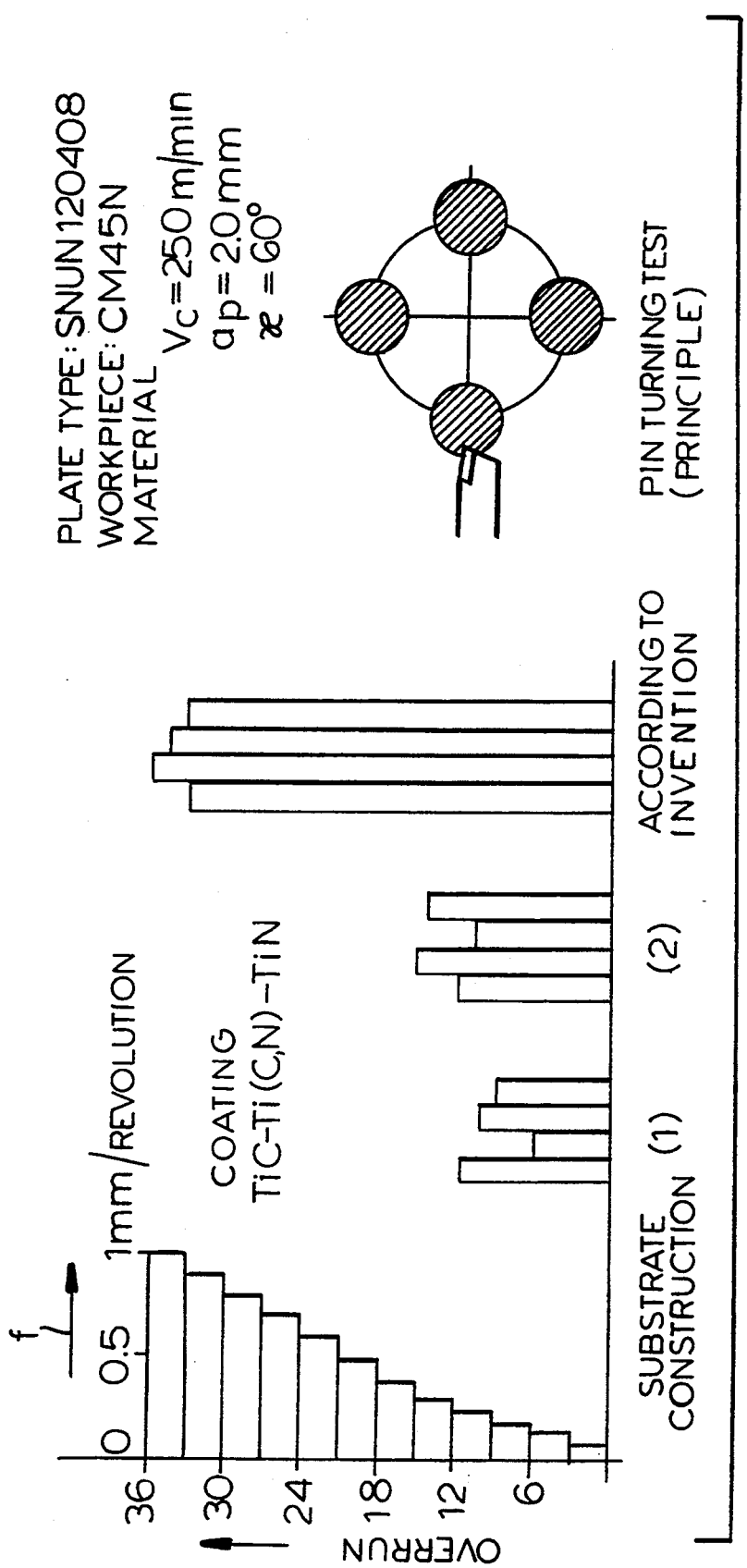
FIG. 4 is a diagram of the results of comparative tests between cutting turning plates (lathe turning tools) fabricated according to the state of the art and those which are fabricated according to the present invention.

To test the improved ductility of the cutting body fabricated according to the invention, a special turning test as illustrated at the right hand side of FIG. 4 was selected, in which four rotating rods of CM 45N steel were subjected to rotation in a plane and after each three turns, the feed, cutting tool advance f, was increased. The individual cutting data can be seen from FIG. 4. It represents: f feed/revolution, $(\alpha)_p$ cutting depth, $V_c$ cutting speed, $(\gamma)$ angle of attack of the turning plate. The cutting tests were terminated when the cutting edge broke out, whereby the results from each four cutting-turning plates is illustrated. With the first cutting plates 1, the substrate is fabricated in the usual manner in accordance with the state of the art and the nitrogen pressure treatment with subsequent vacuum treatment were omitted. The here tested four turning cutting plates 1 were unusable after 6, 9, 10 or 12 overruns.

With the four turning cutting plates (2) the same powder starting mixture was used as has been described and these four turning cutting plates were treated in the same way and manner but additionally with a nitrogen pressure treatment with the subsequent vacuum treatment of FIG. 1 except that the surface was ground at a distance of about 300 μm ahead of the coating. The modified boundary zone was thus completely removed. As FIG. 4 shows, with respect to the, cutting plates 2 the thus fabricated cutting bodies have an only slightly improved ductility by comparison with the turning cutting plates 1; the number of overruns is thus increased to 11, 12, 14, or 15.

Figure 2:
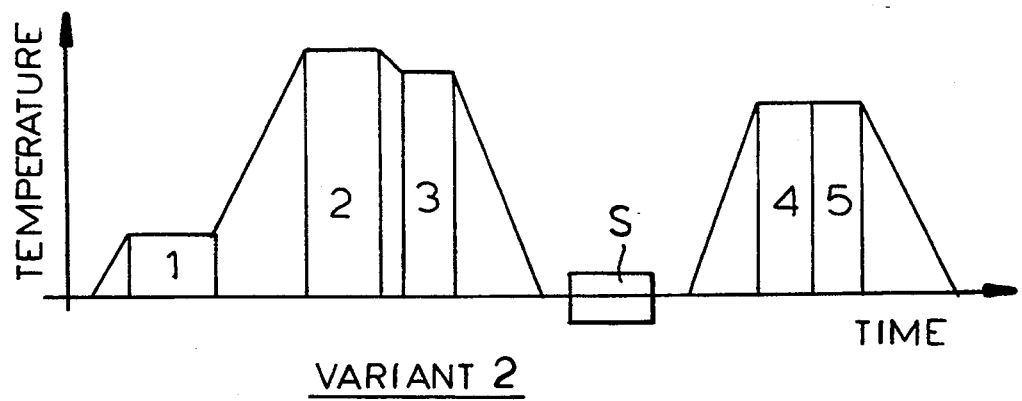

If one utilizes the process described in the previous examples but does not grind away ahead of the coating of the modified boundary zone, the turning cutting plate of the invention has by contrast a significantly improved ductility; The number of overruns increases sharply to 33, 35 or 36 and thus represents a significant improvement. A further example can be drawn from FIG. 2.

In this example the starting mixture comprises 79 weight percent tungsten carbide, 4 weight percent titanium carbide, 7 weight percent tantalum carbide and 10 weight percent cobalt. The first three process steps remain the same as those of FIG. 1 and the above described process is unchanged. Following the sinter-HIP Hot Isostatic Pressing process, however, the hard metal body is cooled to room temperature and, for producing a high precision cutter with the geometric shape SPKN 1504 EDR (according to DIN-German Industrial Standard 6590) is ground reference character S.

After the grinding treatment, a part of the turning cutting plates are heated to a temperature of 1220° C. at a pressure of about 0.1 MPa and thereafter the nitrogen pressure is raised to 6 MPa and maintained at 90 minutes (Process Step 4) before the nitrogen is removed, the environment evacuated and the environment rinsed with nitrogen at a pressure of 100 to 200 Pa (with a duration of 120 minutes at the same temperature).

After shutting down of the heating (about 800° C.) and the vacuum pump, the argon pressure is raised gradually to standard pressure (about 0.1 MPa).

The so treated turning cutting plates are compared with such turning cutting plates which were not subjected to process steps 4 and 5 after CVD (Chemical Vapor Deposition) coating with titanium carbide, titanium nitrocarbide and titanium nitride in the same manner. The coating thickness amounted in total to 5 μm. With the turning cutting plates a block of 42CoMo4V steel with a strength of 980 N/MM² is subjected to planar milling, i.e. planing, whereby the workpiece prior thereto was provided at the surface to be machined with numerous bores of a diameter of 20 mm, to provide additional cut interruptions during the planing test.

The cutting speed amounted to 125 m/min, the tool feed 0.25 mm/tooth and the cutting depth to 2 mm. The planing head of 160 mm diameter was provided with a cutting turning plate. The milling was continued until breakage of the plate. As average values from each six tests, for the turning cutting plate of the invention a mean milling path of 620 mm was obtained by comparison to a mean milling path for a turning cutting plate not treated in accordance with the invention of 280 mm.

The turning cutting plate treated in accordance with the invention had a boundary zone with reduced mixed carbide content and in the more rigorous machining case described previously with additional cutting discontinuities showed a clear improvement in the toughness.

It is claimed:

1. A process for producing a coated cutting body, the process comprising the steps of:
   (a) milling a mixture selected the group which consists of WC, TiC, TaC and NbC and mixtures thereof and containing Co as a binder metal to produce a powder mixture;
   (b) thereafter adding a pressing auxiliary agent to the powder mixture and granulating the powder mixture to produce a granulated powder;
   (c) thereafter compacting the granulated powder to a pressed body;
   (d) thereafter heating the pressed body to a heating temperature ranging from 300° C. to 600° C. under inert gas or in vacuum and maintaining the heating temperature for a period of time sufficient to eliminate the auxiliary agent from the pressed body;
   (e) thereafter sintering the pressed body at a sintering temperature ranging from 1280° C. to 1550° C. and under a sintering pressure between 10 Pa and 0.1 MPa, thereby forming a sintered body;
   (f) thereafter treating the sintered body for at least 0.5 hour under a nitrogen gas pressure ranging from 0.2 MPa to 10 MPa at a temperature 1900° C. to 1300° C.;
   (g) then maintaining the sintered body in an inert gas at a pressure between 10 Pa and 20 kPa for at least 0.5 hour;
   (h) thereafter cooling the sintered body under a pressure from 10 Pa and 0.1 MPa; and
   (i) thereafter applying to the sintered body by Chemical Vapor Deposition (CVD) or Plasma Vapor Deposition (PVD) at least one binder-free hard material layer to form a cutting surface.

2. The process defined in claim 1 wherein step (f) is carried without intervening cooling of the sintered body following step (e).

3. The process defined in claim 1 wherein step (f) follows steps of cooling and grinding of the sintered body formed in step (e).

4. The process defined in claim 3 wherein cooling of the sintered body is conducted under a nitrogen free protective gas at a pressure between 10 Pa and 0.1 Mpa.

5. The process defined in claim 4 wherein the protective gas is selected from the group consisting of argon and hydrogen.

6. The process defined in claim 1 wherein step (e) is directly followed by a step of pressure treating of the sintered body under a nitrogen free protective gas pressure between 1 to 10 MPa and at a temperature from 1280° to 1550° without intervening cooling of the sintered body formed in step (e).

7. The process defined in claim 1 wherein the binder free hard material layer has a thickness from 3 to 15 μm.

8. The process defined in claim 1 wherein the binder free hard material layer has a thickness from 5 to 10 μm.

9. The process defined in claim 1 wherein the step (d) is directly followed by a step of further heating the pressed body free from the auxiliary agent at a temperature ranging from 1280° C. to 1550° C. under a nitrogen atmosphere of a pressure of up to 0.1 MPa for at least 30 minutes.

10. The process defined in claim 9 wherein the pressed body free from the auxiliary agent is heated for a period of time of 45 minutes to 60 minutes.

11. The process defined in claim 1 wherein the powdered mixture formed in the step (a) contains from 0.5 to 2 weight percent of a material selected from a group consisting of a nitride or carbonitride of at least one element selected from the group consisting of Ti, Ta and Nb.

12. The process defined in claim 1 wherein the pressed body contains 2 to 30 weight percent of cubic carbides and 4 to 15 weight percent Co as a binder material.

* * * * *